United States Patent [19]

Benoit-Gonin et al.

[11] 4,377,760
[45] Mar. 22, 1983

[54] DEVICE FOR READING A QUANTITY OF ELECTRIC CHARGE

[75] Inventors: Roger Benoit-Gonin; Jean-Luc Berger; Sylvain Fontanes; Jean-Edgar Picquendar, all of Paris, France

[73] Assignee: Thompson-CSF, Paris, France

[21] Appl. No.: 152,350

[22] Filed: May 22, 1980

Related U.S. Application Data

[63] Continuation of Ser. No. 902,046, May 2, 1978, abandoned.

[30] Foreign Application Priority Data

May 6, 1977 [FR] France .................................. 77 13857

[51] Int. Cl.³ ...................... H03K 5/19; H03K 5/153; G01R 19/00; H03H 15/00
[52] U.S. Cl. .................................. 307/530; 353/165; 377/60
[58] Field of Search ............ 307/DIG. 3, 221 D, 530, 307/352, 353, 304; 365/183; 353/165

[56] References Cited

U.S. PATENT DOCUMENTS

| | | | |
|---|---|---|---|
| 3,623,132 | 11/1971 | Green | 307/221 D X |
| 3,819,953 | 6/1974 | Puckette et al. | 307/353 X |
| 3,819,954 | 6/1974 | Butler et al. | 307/221 D |
| 3,877,056 | 4/1975 | Bailey | 307/221 D X |
| 3,903,431 | 9/1975 | Heeren | 307/453 |
| 3,949,245 | 4/1976 | Emmons et al. | 307/221 D X |
| 4,082,963 | 4/1978 | Hoffmann | 307/221 D X |
| 4,084,256 | 4/1978 | Engeler et al. | 307/221 D X |
| 4,104,543 | 8/1978 | Maeding | 307/221 D |
| 4,123,733 | 10/1978 | Poirier | 307/221 D X |
| 4,137,464 | 1/1979 | Heller et al. | 307/221 D X |

OTHER PUBLICATIONS

Heller, *IBM Tech. Discl. Bull.;* vol. 18, No. 4, pp. 1230–1232, 9/1975.
Engeler et al., *IEEE-JSSC,* vol. SC-7, No. 5, pp. 330–335; 10/1972.
Mok et al., *Solid–State Electronics,* (Pub), 1974, vol. 17, No. 11, pp. 1147–1154.

*Primary Examiner*—Larry N. Anagnos
*Attorney, Agent, or Firm*—Roland Plottel

[57] ABSTRACT

An analog device for reading a quantity of electric charge, for example, in a transversal charge transfer filter. The device includes a capacitor and two MOS transistors which are connected in series to the point in the filter where the charge is to be read. The capacitor is connected to the common point of the two transistors which are controlled in phase opposition to insure charging of the capacitor. The capacitor maintains a potential at the charge reading point constant. Any variation in the quantity of charge under an electrode is converted into a variation of potential at the common point and this forms the read signal which is detected by means of a third MOS transistor.

8 Claims, 11 Drawing Figures

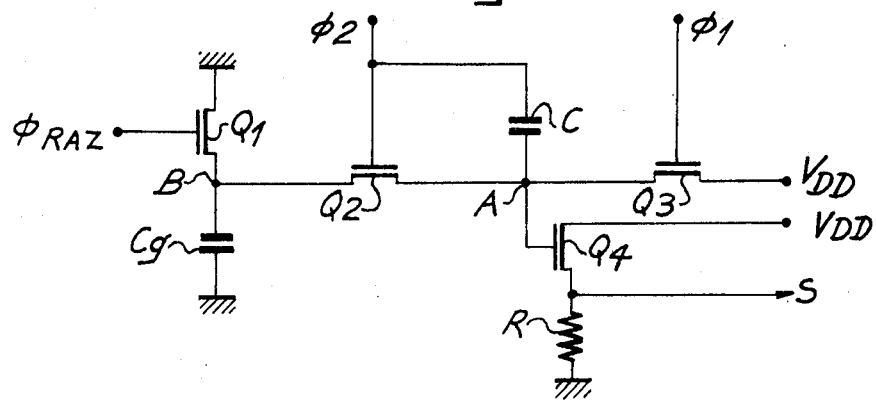
Fig_1
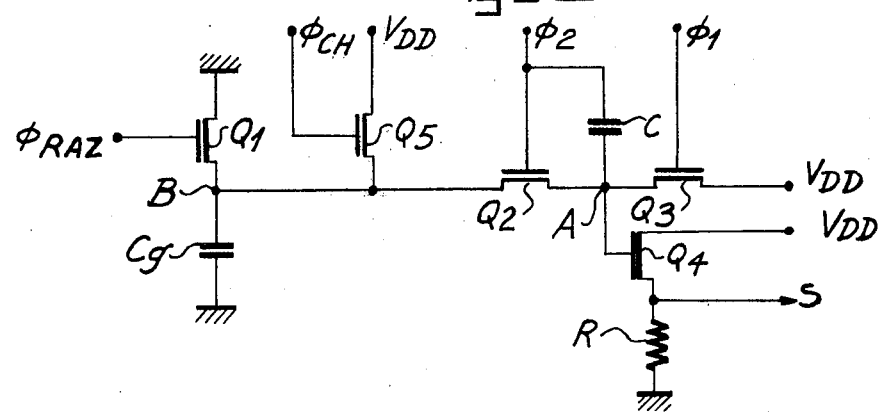
Fig_3
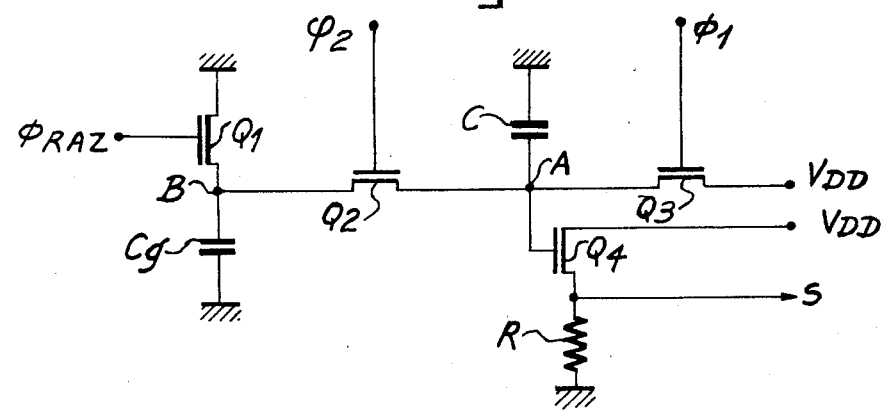
Fig_4

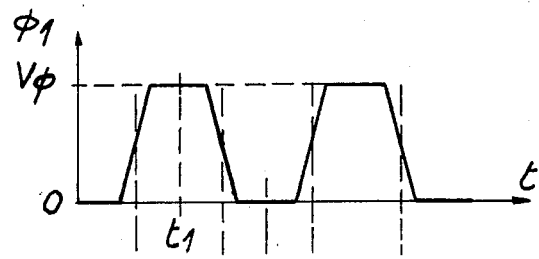
Fig_2(a)
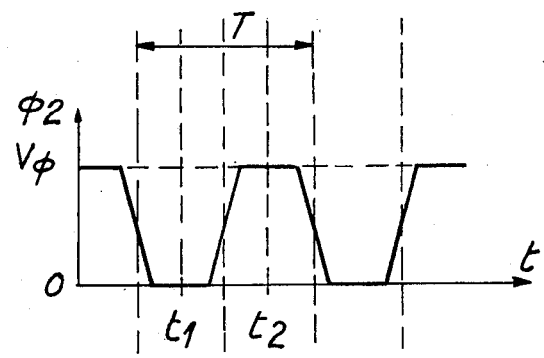
Fig_2(b)
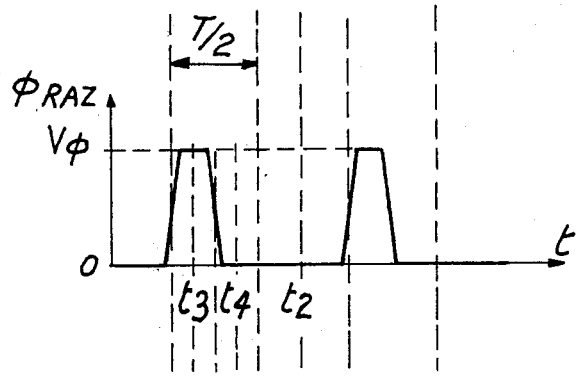
Fig_2(d)
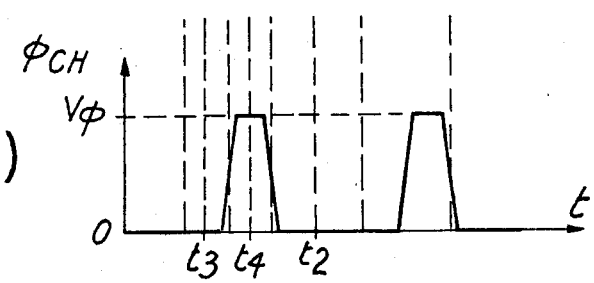
Fig_2(c)

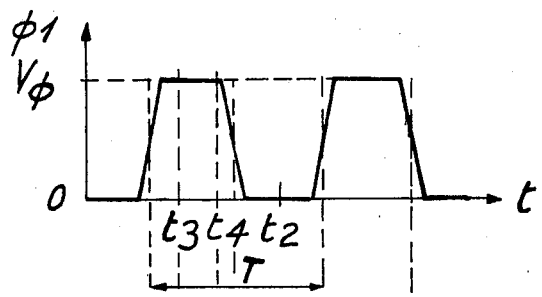
Fig_5(a)
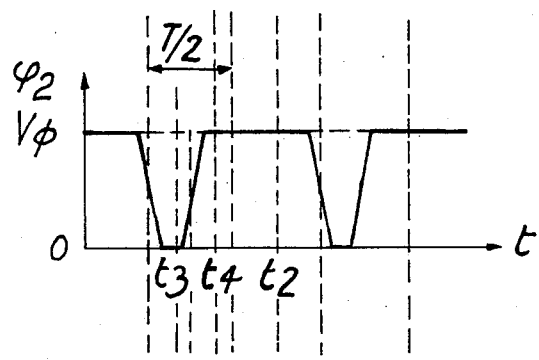
Fig_5(b)
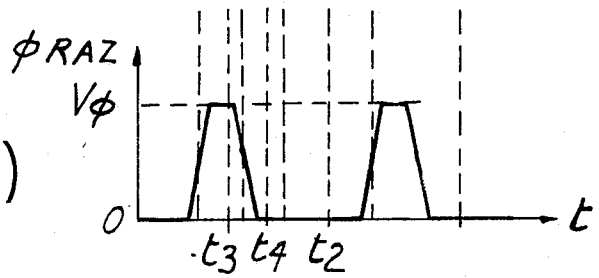
Fig_5(c)

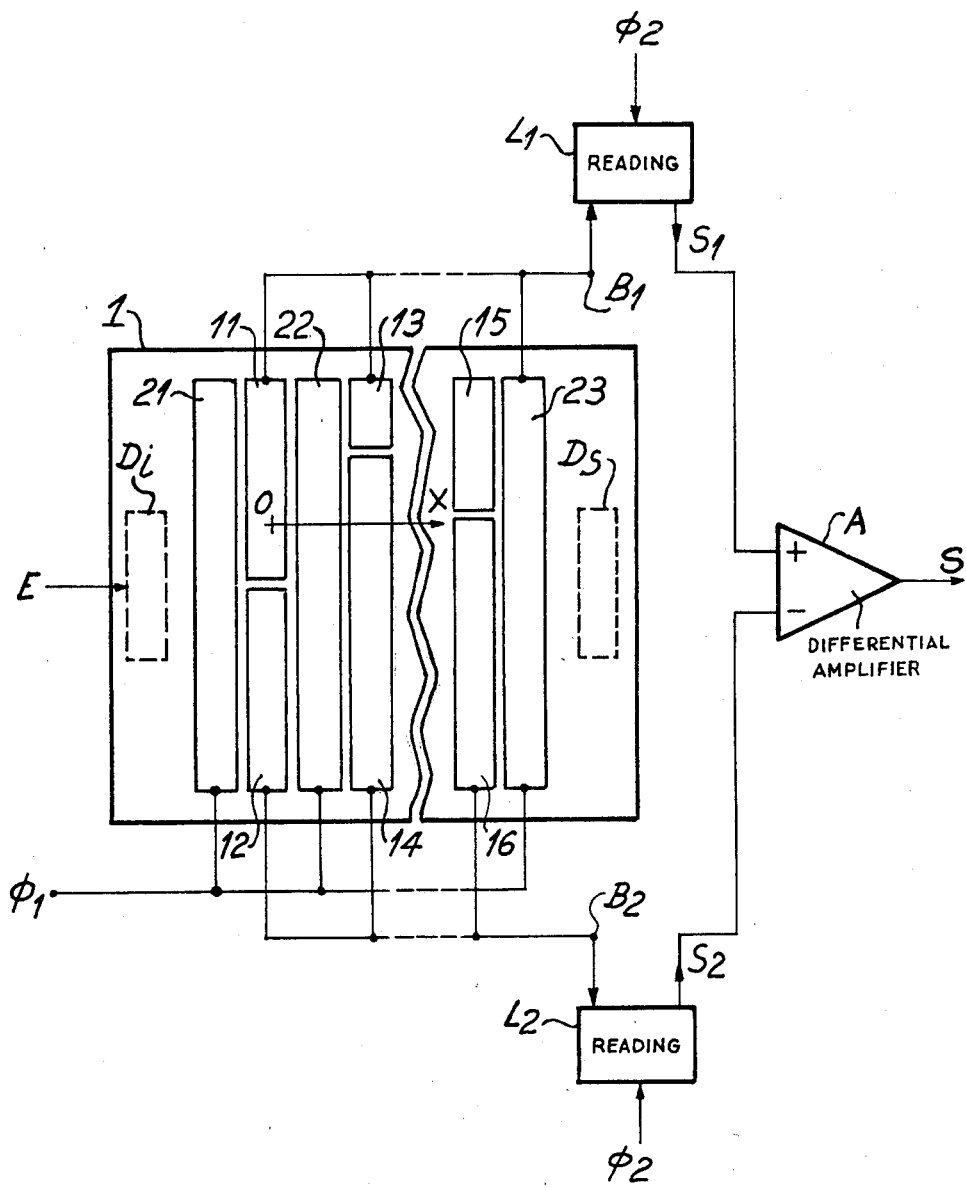

DEVICE FOR READING A QUANTITY OF ELECTRIC CHARGE

This is a continuation of application Ser. No. 902,046 filed May 2, 1978, and now abandoned.

The present invention covers a device for reading a quantity of electric charges which is applicable in particular to filters using the charge transfer in a semiconductor.

It may be remembered that a charge transfer filter, often called a transversal filter, consists of a semiconductor substrate covered with an insulator on which are arranged the electrodes that ensure, by the application periodically of specific potentials, the transfer of packets of electric charges which represent the signal to be processed. These electrodes are arranged parallel to one another and crosswise with respect to the charge transfer direction. Some of them are split into two unequal parts crosswise and the quantities of charges which reach these electrodes are read differentially to obtain signal weighting.

The reading of a quantity of charges under an electrode can be obtained by two methods:

by a voltage reading method, which consists in keeping the electrode under consideration insulated during the arrival of the charges and in watching the evolution of the voltage. As is known, this method requires a high value for the capacitor formed by the substrate, the insulating layer and the electrode and results in low values for the output signal. Also, the presence of depletion zones under the electrodes introduces non-linearities on the one hand and this method does not give high precision in the weighting coefficient mentioned above on the other, by a current or charge reading method, which consists in keeping the electrode potential constant and in integrating the current corresponding to the arrival of the charges.

This last method enables the disadvantages of voltage reading to be avoided but, in known embodiments, it requires high gain amplifiers. The disadvantages are that it is difficult to integrate them on the same substrate as the filter on the one hand and that their consumption is high on the other.

The present invention covers a stage reading quantities of charges, which can be used in particular in a charge transfer filter and is able to be integrated in the filter substrate without the disadvantages mentioned above.

According to the invention, there is provided a device for reading a quantity of electric charges, comprising a first and a second transistor which are connected in series to an arrival point of said quantity of charges, a first capacitor having two terminals, the first of them being connected to the common point of said transistors, said transistors being made conducting alternately and charging said capacitor, the latter keeping said arrival point at constant potential when said charges arrive, this arrival then making a change in the potential at said common point, said change forming a read signal.

For a better understanding of the invention and to show how it can be carried into effect, reference will be made to the following description and the drawings with it which show:

in FIG. 1, one embodiment of a reading device in accordance with the invention, in FIGS. 2(a–d), diagrams of signals applied to the device in accordance with the invention, in FIG. 3, a variant embodiment of a device in accordance with the invention, in FIG. 4, another embodiment of a device in accordance with the invention, In FIGS. 5(a–c), diagrams of signals applied to the device in FIG. 4, in FIG. 6, a schematic of a known type of charge transfer filter to which is applied a device in accordance with the invention.

In these various Figures, the same references refer to the same elements.

In FIG. 1 are shown two MOS type transistors $Q_2$ and $Q_3$, also called TMOS, which are in series with their common point ($Q_2$ drain and $Q_3$ source) market A. A capacitor C is connected to point A, its other terminal, which is connected to the gate of TMOS $Q_2$, receiving a signal $\phi_2$. The other terminal of TMOS $Q_3$, i.e. its drain on the schematic in FIG. 1, is connected to an external voltage source $V_{DD}$ while the gate of this same TMOS receives a signal $\phi_1$. The other terminal (source) of TMOS $Q_2$ (point B) receives the quantity of charges to be measured through a capacitor $C_g$, which is therefore connected between point B and ground. In the case in which the device shown in this figure is applied to a charge transfer filter, capacitor $C_g$ is the one which is formed by the electrode where reading is to take place, the semiconductor substrate where the charges are transferred and the insulating layer separating these two elements, taking into account the capacity due to the depletion zone which forms in the semiconductor under the electrode being considered.

The device in FIG. 1 also has an arrangement for resetting it to zero in the form of a TMOS $Q_1$, which is connected between point B and ground and is controlled by a signal $\phi_{RAZ}$ received on its gate. Finally, it has a system for reading at high impedance the voltage at point A, which consists, for example, in the figure of a fourth TMOS ($Q_4$) connected with its drain common and receiving the signal available at A on its gate. It is connected by one of its terminals (drain) to an external voltage which may, with advantage, be the same potential $V_{DD}$ as previously and by its other terminal (source) to ground through a resistor R. The reading signal S is available at the terminals of resistor R.

FIG. 2 shows diagrams of signals applicable to a device in accordance with the invention. For the operation of the device in FIG. 1 only diagrams a and b of FIG. 2 are to be considered.

Diagram a shows a signal $\phi_1$, which is roughly a squarewave, of period T and amplitude varying between O and $V_\phi$.

Diagram b shows a signal $\phi_2$, which is preferably of the same shape as $\phi_1$ but which must be out of phase with $\phi_1$ by T/2.

The device in FIG. 1 operates as follows:

TMOSs $Q_2$ and $Q_3$ set up voltages at points A and B in the circuit.

At instant $t_1$, $\phi_1 = V_\phi$ and $\phi_2 = 0$, i.e. TMOS $Q_3$, which is controlled by $\phi_1$, is conducting whereas $Q_2$, which is controlled by $\phi_2$, is cut off. As a result, the potential at A becomes $(V_{DD} - V_T)$ if $V_T$ is the threshold voltage for TMOS $Q_3$, this being roughly the same value for the four TMOSs $Q_1 \ldots Q_4$. Hence, capacitor C, between $\phi_2 = 0$ and $(V_{DD} - V_T)$, charges up.

It may be noted that, if the signal applied to the gate of TMOS $Q_3$, $V_{\phi_1}$, is sufficiently large, i.e.

$V_{\phi 1} - V_T > V_{DD}$, TMOS Q3 will operate as a triode and roughly the voltage $V_{DD}$ will be obtained at A.

At instant $t_2$, $\phi_1 = 0$ and $\phi_2 = V_\phi$. This causes TMOS Q2 to conduct and TMOS Q3 to be cut off. The potential at A then becomes $V_A = (V_{DD} - V_T) + V_\phi$ since capacitor C retains its charge and $\phi_2$ becomes equal to $V_\phi$. As TMOS Q2 is conducting, capacitor Cg charges up until the potential at B becomes $(V_\phi - V_T)$, the value at which Q2 is cut off (the potential on the grid of Q2 being $V_\phi$). Only $V_{DD}$ is left at A and capacitor C discharges by $\Delta Q = Cg (V_\phi - V_T)$.

When point B receives a quantity of signal charges $\Delta Q_s$ to be measured, the latter acts as a charge that capacitor C must supply in addition to produce potential $(V_\phi - V_T)$ at B. Capacitor C therefore discharges the quantity:

$$\Delta Q' = Cg(V_\phi - V_T) + \Delta Q_s$$

The potential at point A becomes:

$$V_A = (V_{DD} - V_T) + V_\phi - \frac{\Delta Q'}{C} =$$

$$V_{DD} + (V_\phi - V_T)\left(1 - \frac{Cq}{C}\right) - \frac{\Delta Q_s}{C}$$

which can be reduced to $V_A = V_{DD} - (\Delta Q_s/C)$ if C=Cg.

Hence, a voltage proportional to the signal charge $\Delta Q_s$ is obtained at A while the voltage at point B remains constant at $(V_\phi - V_T)$. Reading of the voltage at point A is done at high impedance by TMOS Q4 which is a source follower.

The only function of TMOS Q1 is the evacuation of charges from point B after the reading operation, i.e. resetting the device to zero. It is controlled by a signal $\phi_{RAZ}$ which may be the same as $\phi_1$.

The diagrams in FIG. 2 correspond to the case in which enhancement type, N channel, MOS transistors are used and fed between 0 V and $+V_{DD}$. If enhancement type, P channel, TMOSs are used, they must be fed between 0 V and $-V_{DD}$ and controlled by signals inverted with respect to those in FIG. 2, i.e. varying between 0 V and $-V_\phi$. However, it is preferable to use enhancement type, N channel TMOSs, in particular for Q3 as this has the advantage of allowing a reduction in the amplitude of control signal $\phi_1$ for the same voltage $V_{DD}$.

In a variant embodiment which is not shown of the device in FIG. 1, it is possible to connect the terminal of TMOS Q3, which was connected to an external source of potential ($V_{DD}$), directly to signal $\phi_1$. Technological and consumption considerations may however lead to the schematic shown in FIG. 1 being adopted so that the generators of signals $\phi_1$ and $\phi_2$ may not be too heavily loaded.

Also, in the same case in which the drain of Q3 is connected to $\phi_1$, signals $\phi_1$ and $\phi_2$ may be of different amplitudes, $V_{\phi 1}$ and $V_{\phi 2}$ respectively. For capacitor C to charge Cg, $$C(V_{\phi 1} - V_T) \geq Cg (V_{\phi 2} - V_T) \qquad (1)$$

which means $V_{\phi 1} \geq V_{\phi 2}$ when $C < Cg$.

Hence, it is possible to increase the signal amplitude at A for a given charge $\Delta Q_s$ by reducing C and increasing $V_{\phi 1}$. From (1) a lower limit for C can be deduced:

$$C = Cg \cdot \frac{V_{\phi 2} - V_T}{V_{\phi 1} - V_T}$$

As an example, the output signal amplitude can be doubled if $C = Cq/2$ and $V_{\phi 1} = 2V_{\phi 2} - V_T$.

However, there is a limit to the reduction in the value of C. In the device in FIG. 1, this capacitor must be sufficiently large to be able to charge capacitor Cg. FIG. 3 is a variant of the device in accordance with the invention in which precharging of capacitor Cg to $V_\phi - V_T$ is done by an auxiliary TMOS before the arrival of signal charges $\Delta Q_s$.

FIG. 3 shows the device of FIG. 1 to which has been added an auxiliary TMOS Q5 connected to point B. This TMOS is controlled by a signal $\phi_{CH}$ and it is connected by its other terminal (drain) either to an external potential source, which may be the same as for Q3 and Q4 ($V_{DD}$), as shown, or to signal $\phi_{CH}$.

The way in which TMOSs Q1 and Q5 are assembled in this embodiment requires a shape different from $\phi_1$ for signal $\phi_{RAZ}$. It must be in phase opposition to $\phi_{CH}$. The shape of signals $\phi_{CH}$ and $\phi_{RAZ}$ is given in FIG. 2 by diagrams c and d. $\phi_{CH}$ and $\phi_{RAZ}$ are roughly identical signals in the form of square waves in which the length of the upper part is of the order of T/4, out of phase one with respect to the other by T/4, and the amplitude is about $\phi_1$ ($V_\phi$).

In the device in FIG. 3, the first phase of operation, which corresponds to instant $t_1$ for the device in FIG. 1, is divided into two phases represented by instants $t_3$ and $t_4$ in FIG. 2, c and d.

At instant $t_3$, $\phi_{CH} - 0$ and $\phi_{RAZ} = V_\phi$. This is the phase in which the device is reset to zero after a reading and it takes place as before.

At instant $t_4$, $\phi_{RAZ} = 0$ and $\phi_{CH} = V_\phi$ whereas $\phi_1 = V_\phi$ and $\phi_2 = 0$. TMOS Q5, which is then conducting, supplies potential $(V_\phi - V_T)$ to point B which enables capacitor Cg to be charged. Simultaneously, TMOS Q3, which is also conducting, supplies potential $(V_{DD} - V_T)$ to point A. Points A and B are insulated from one another by Q2 which is cut off.

At instant $t_2$, which was previously described, $\phi = \phi_{RAZ} = \phi_{CH} = 0$ and $\phi_2 = V_\phi$, i.e. only TMOS Q2 is conducting. As point B has already been raised separately to potential $V_\phi - V_T$, it can be seen that capacitor C has only to compensate for the addition of signal charge $\Delta Q_s$. This results in a variation in the voltage at A:

$V = \Delta Q_s/C_g$ which is measured as before by means of TMOS Q4.

Condition (1) above, which is $C(V_{\phi 1} - V_T) \geq C_g(V_{\phi 2} - V_T)$ becomes $C(V_{\phi 1} - V_T) \geq \Delta Q_s$ and this enables C to be greatly reduced.

However, there is a lower limit for capacitor C, which is related to TMOS Q4, that is used for reading, and to the existence of a threshold voltage ($V_T$). Knowing that the potential at A is $(V_{DD} - V_T)$, it may be written:

$$C_{min} = \frac{\Delta Q_s}{(V_{DD} - V_T) - V_T}$$

The presence of TMOS $Q_5$ also leaves the possibility of obtaining at B a potential different from that previously obtained by using for the polarizing potential a value different from $V_{DD}$.

FIG. 4 shows another embodiment of the device in accordance with the invention, in which capacitor C is connected not to the gate of TMOS $Q_2$, but directly to the reference potential (ground), as shown, or to some fixed potential between this reference potential and $V_{DD}$. Also, the control signal for TMOS $Q_2$ is now marked $\varphi_2$.

FIG. 5 shows diagrams (a, b and c) of signals likely to be applied to the device in FIG. 4.

Diagram (a) in FIG. 5 shows signal $\phi_1$ unchanged.

Diagram (c) shows signal $\phi_{RAZ}$ unchanged.

Diagram (b) in this same figure shows signal $\varphi_2$ which controls TMOS $Q_2$ instead of signal $\phi_2$ in the preceding figures. Signal $\varphi_2$ is analogous to $\phi_2$ but leads in phase T/4 with respect to the latter. It can become the complemented signal of $\phi_{RAZ}$ as shown in the drawings.

The device functions as follows:

during time $t_3$, $\phi_1 = V_\phi$ and $\phi_{RAZ} = V_\phi$. Hence, TMOS $Q_3$ and $Q_1$ are conducting while $\varphi_2 = 0$ cutting off TMOS $Q_2$. Point A is therefore raised to a potential $(V_{DD} - V_T)$ and capacitor C charges up;

during time $t_4$, $\phi_1$ remains $V_\phi$ but $\phi_{RAZ}$ becomes 0 and $\varphi_2$ becomes $V_\phi$. TMOS $Q_2$ and $Q_3$ conduct simultaneously enabling capacitor $C_g$ to be charged to $(V_{DD} - V_T)$ if $\varphi_2$ is big enough, i.e. higher than the potential at A, for TMOS $Q_2$ to operate as a triode. Precharging of capacitor $C_g$ therefore occurs during this phase;

during time $t_2$, $\phi_1 = 0$ and $Q_3$ is cut off isolating capacitor C from all external sources. The device is then ready to receive the arrival of charges $\Delta Q_S$ to be measured at the terminals of capacitor $C_g$. At this instant, the capacitor discharges to compensate for the charge arrival and causes a potential difference of $\Delta Q_s/C$ at point A, which is measured as before by TMOS $Q_4$.

It may be noted that, in the case in which a device in accordance with the invention is applied to a charge transfer filter as shown below in FIG. 6, it is advantageous to control the latter with signals whose phases are identical to those of $\phi_1$ and $\phi_2$ as described above. The charges then arrive under the electrode where the measurement is to be made in phase with $\phi_2$, i.e. opposite in phase to $\phi_1$, i.e. during time $t_2$.

This variant of the device in accordance with the invention offers the same advantage as the one in FIG. 3, i.e. a small value for capacitor C (which only has to supply $\Delta Q_s/Q$) making possible a large sweep of the signal but without the addition of an auxiliary TMOS ($Q_5$ in FIG. 3).

In FIG. 6 is shown a schematic embodiment of a transversal filter using the charge coupled device (C.C.D.) technique, to which a device in accordance with the invention may be applied.

Such filters are known and described in particular in an article "Transversal filtering using charge-transfer devices" in the I.E.E.E. Journal of Solid State Circuits (April 1973, Vol. SC 8, No. 2, page 138). These filters are of the type containing a shift register, the input signal being picked up at the level of each stage and a weighting coefficient being applied to it, the various signals thus obtained being added to form the filter output signal.

This device contains a semiconductor substrate 1, covered with an insulating layer which is itself covered with electrodes (11 to 16 and 21 to 23 in the Figure). There are diodes, $D_i$ and $D_s$ respectively, at the two ends of the device in substrate 1, their purpose being, for the first ($D_i$), to inject into substrate 1 a quantity of charges representing an input signal E in accordance with a known technique and, for the second ($D_s$), to collect the charges for their removal.

The electric charges are transferred from $D_i$ to $D_s$ in the direction Ox by means of the electrodes already mentioned, which are perpendicular to Ox and form the elements of a shift register. Every other electrode (electrodes 11-12, 13-14 and 15-16 in the figure) is split into two parts to provide the weighting coefficient mentioned above. The split electrodes are connected to signal $\phi_2$ and the unsplit ones to signal $\phi_1$.

In operation, as is known, fixed quantities of charges, corresponding to input signal E, are moved in succession under each of the electrodes thanks to the application of signals $\phi_1$ and $\phi_2$ to them. When they pass under each split electrode (11, 12, 13, 14, 15 and 16), the charges are read by means of two devices such as are described in FIGS. 1 to 5, which are respectively $L_1$ for half-electrodes 11, 13 and 15, which are all connected to point $B_1$ corresponding to point B in the preceding figures, and $L_2$ for the half-electrodes opposite them, 12, 14 and 16, which are connected to point $B_2$, which is analogous to $B_1$. In this schematic, capacitor $C_g$ of the preceding Figures is formed by a read electrode, the insulating layer on which it is deposited and the semiconductor substrate.

Elements $L_1$ and $L_2$ each supply a read signal, $S_1$ and $S_2$ respectively, which feeds differential amplifier A that supplies signal S. Signal S therefore represents a sample of the filtered signal.

It may be noted that the signals ($\phi_1$ and $\phi_2$) used for filter 1 have the same reference as those used for elements $L_1$ and $L_2$. They may however be different from the latter, in amplitude in particular, provided that they remain in phase with them.

The use of devices $L_1$ and $L_2$ in accordance with the invention, as they can be easily integrated in a charge transfer filter, enables the filter and its auxiliary read elements to be integrated on the same semiconductor substrate.

What is claimed is:

1. An analog device for reading a quantity of electric charge, which comprises:
   (a) first ($Q_2$; FIG. 1) and second ($Q_3$) transistors which are connected in series to an arrival point for said quantity of charge, said first transistor, when conducting, operating in essentially a saturation mode, said second transistor, when conducting, operating in essentially a triode mode;
   (b) a first capacitor (C) having two terminals, a first one of said terminals being connected to the common point (A) of said serially connected first and second transistors, and said second terminal is connected to an external voltage source;
   (c) means for supplying a d.c. potential ($V_{DD}$) from an external source to said second transistor and in series with said transistors; and
   (d) means ($\varphi_2$, $\phi_1$) for alternately driving said first and second transistors ($Q_2$, $Q_3$) into conduction thereby to charge said first capacitor to a potential which approaches said d.c. potential, said capacitor maintaining said arrival point (B) at a constant potential even when said quantity of charge arrives, the arrival of said quantity of charge causing a corresponding change in the potential of said common point (A), said change comprising a read signal from said device; and wherein said alternately driving means ($\phi_2$, $\phi_1$) drives said first and second transistors into conduction for times which overlap for a quarter of a period the control signal for said second transistor.

2. The analog device according to claim 1, further comprising:
(f) a third transistor (Q1) connected between ground and said arrival point for resetting said device to zero subsequent to a read operation, said third transistor being controlled by a signal which is in phase with the signal (QRAZ) controlling said second transistor.

3. The analog device according to claim 1 wherein said first and second transistors comprise MOS transistors.

4. The analog device according to claim 3 wherein said first and second transistors and said first capacitor are integrated on a common semi-conductor substrate.

5. The analog device according to claim 1 wherein the electrode of said second transistor which is not connected to said common point is connected to said external potential supply means.

6. The analog device according to claim 1 wherein the electrode of said second transistor which is not connected to said common point is connected to the gate electrode of the same transistor.

7. A charge transfer filter which comprises:
(a) a semi-conductor substrate covered with an insulating layer;
(b) a plurality of electrodes on said insulating layer for controlling the charge transfer;
(c) an analog device for reading a quantity of electric charge which comprises:
 (1) first and second transistors which are connected in series to an arrival point for said quantity of charge, said first transistor, when conducting, operating in essentially a saturation mode, said second transistor, when conducting, operating in essentially a triode mode;
 (2) a first capacitor having two terminals, a first one of said terminals being connected to the common point of said serially connected first and second transistors, and the other being connected to an external voltage source;
 (3) means for supplying a d.c. potential from an external source to said second transistor and in series with said transistors;
 (4) means for alternately driving said first and second transistors into conduction for times which overlap for a quarter of a period the control signal for said second transistor thereby to charge said first capacitor to a potential which approaches said d.c. potential, said capacitor maintaining said arrival point at a constant potential even when said quantity of charge arrives, the arrival of said quantity of charge causing a corresponding change in the potential of said common point, said change comprising a read signal from said device, and
(d) a second capacitor connected to said arrival point for storing said charge, said second capacitor being formed by said substrate, said insulating layer and one electrode from said electrodes where reading occurs.

8. An analog device for reading a quantity of electric charge, which comprises:
(a) first (Q2; FIG. 1) and second (Q3) transistors which are connected in series to an arrival point for said quantity of charge, said first transistor, when conducting, operating in essentially a saturation mode, said second transistor, when conducting, operating in essentially a triode mode;
(b) a first capacitor (C) having two terminals, a first one of said terminals being connected to the common point (A) of said serially connected first and second transistors;
(c) means for supplying a d.c. potential ($V_{DD}$) from an external source to said second transistor and in series with said transistors;
(d) means for alternately driving said first and second transistors into conduction thereby to charge said first capacitor to a potential which approaches said d.c. potential, said capacitor maintaining said arrival point at a constant potential even when said quantity of charge arrives, the arrival of said quantity of charge causing a corresponding change in the potential of said common point, said change comprising a read signal from said device;
(e) a second capacitor connected to said arrival point to store said quantity of charge;
(f) a third transistor (Q1) connected between ground and said arrival point, for resetting said device to zero subsequent to a read operation, said third transistor being controlled by a signal ($\phi_{RAZ}$) which is in phase with the signal controlling second transistor; and
(g) a fourth transistor (Q5) connected to said arrival point for charging said second capacitor to a predetermined value prior to the arrival of said quantity of charge, said fourth transistor being controlled by a signal ($\phi_{CH}$) which is in phase opposition to the signal controlling said third transistor, the control signals for said third and fourth transistors having the same pulse width, said pulse width being equal to half the pulse width of the control signal for said second transistor.

* * * * *